(12) United States Patent
Kroener

(10) Patent No.: US 7,632,712 B2
(45) Date of Patent: Dec. 15, 2009

(54) METHOD OF FABRICATING A POWER SEMICONDUCTOR MODULE

(75) Inventor: Friedrich Kroener, Villach (AT)

(73) Assignee: Infineon Technologies AG, Neubiberg (DE)

( * ) Notice: Subject to any disclaimer, the term of this patent is extended or adjusted under 35 U.S.C. 154(b) by 10 days.

(21) Appl. No.: 11/828,843

(22) Filed: Jul. 26, 2007

(65) Prior Publication Data
US 2009/0008769 A1    Jan. 8, 2009

(30) Foreign Application Priority Data
Jul. 6, 2007    (DE) .................. 10 2007 031 490

(51) Int. Cl.
*H01L 21/44* (2006.01)
(52) U.S. Cl. .................. 438/110; 438/113; 438/458; 257/E25.005
(58) Field of Classification Search .................. 438/110, 438/113, 458
See application file for complete search history.

(56) References Cited

U.S. PATENT DOCUMENTS

| | | | |
|---|---|---|---|
| 5,156,999 A | 10/1992 | Lee | |
| 5,641,944 A | 6/1997 | Wieloch et al. | |
| 6,411,642 B1* | 6/2002 | Mazed | ..................... 372/103 |
| 7,069,645 B2 | 7/2006 | Ishikawa et al. | |
| 2005/0260796 A1 | 11/2005 | Takahashi | |
| 2006/0022326 A1 | 2/2006 | Morita et al. | |
| 2006/0071238 A1 | 4/2006 | Guerra et al. | |
| 2006/0145334 A1 | 7/2006 | Tsukada et al. | |
| 2006/0263584 A1* | 11/2006 | Schulz-Harder et al. | . 428/292.1 |
| 2007/0287265 A1* | 12/2007 | Hatano et al. | ............... 438/458 |
| 2007/0296065 A1* | 12/2007 | Yew et al. | .................... 257/659 |

FOREIGN PATENT DOCUMENTS

| | | |
|---|---|---|
| DE | 69207410 | 3/1994 |
| DE | 4201910 | 5/1995 |
| DE | 4444680 | 6/1996 |
| DE | 3544324 | 9/1997 |
| DE | 19719648 | 11/1998 |
| DE | 10101086 | 7/2001 |
| DE | 102005047106 | 4/2007 |
| DE | 102007004005 A1 | 10/2007 |
| EP | 0049791 | 4/1982 |
| GB | 2417824 A | 8/2006 |
| JP | 59151437 | 8/1984 |

\* cited by examiner

*Primary Examiner*—Hsien-ming Lee
(74) *Attorney, Agent, or Firm*—Dicke, Billig & Czaja, PLLC

(57) ABSTRACT

A semiconductor module is disclosed. One embodiment provides a first electrically conductive carrier composed of a first material, a second electrically conductive carrier composed of the first material, an electrically insulating element composed of a second material, which connects the first carrier and the second carrier to one another, a first semiconductor substrate applied to the first carrier, a second semiconductor substrate applied to the second carrier, and an electrically conductive layer applied above the first carrier, the second carrier and the insulating element. The electrically conductive layer electrically conductively connects the first semiconductor substrate to the second semiconductor substrate.

13 Claims, 5 Drawing Sheets

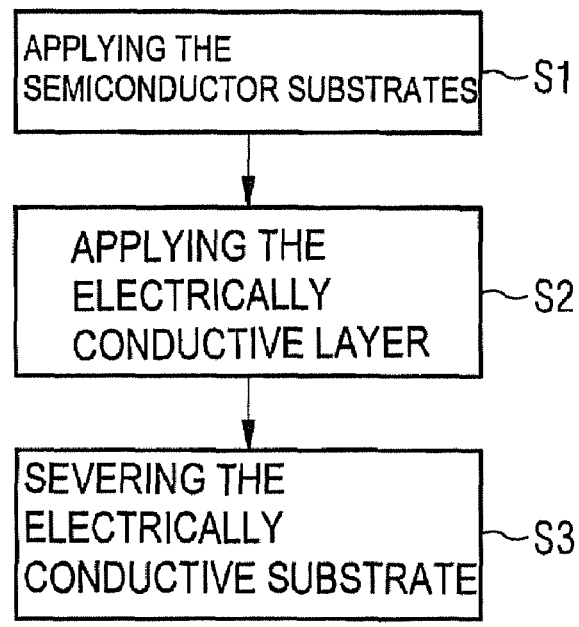
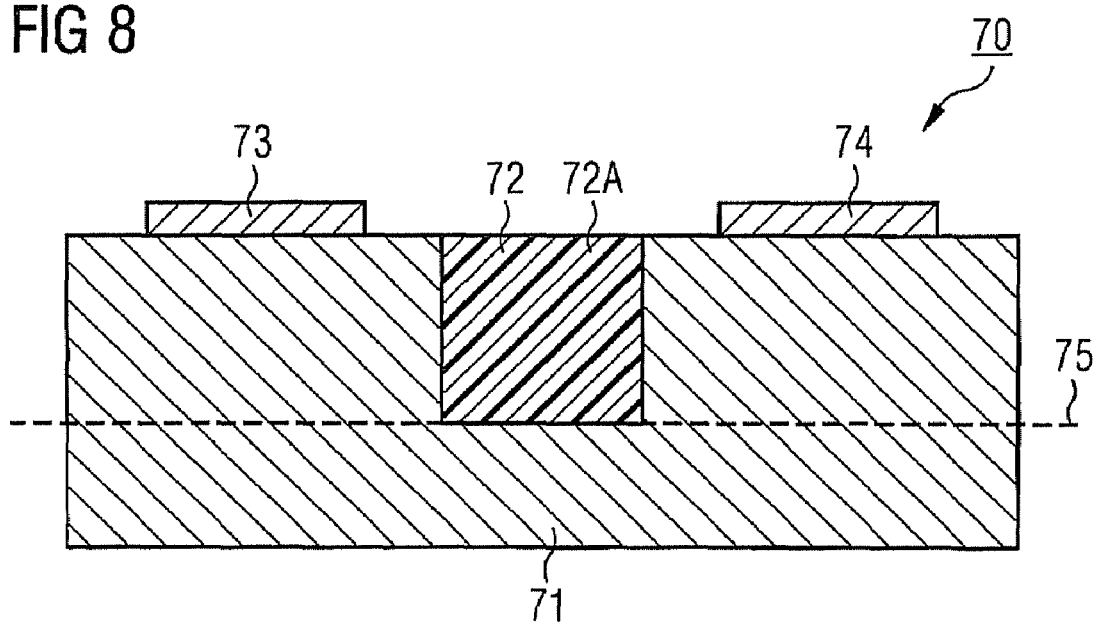

METHOD OF FABRICATING A POWER SEMICONDUCTOR MODULE

CROSS-REFERENCE TO RELATED APPLICATIONS

This Utility Patent Application claims priority to German Patent Application No. DE 10 2007 031 490.8 filed on Jul. 6, 2007, which is incorporated herein by reference.

BACKGROUND

The present invention relates to a semiconductor module and a method for producing a semiconductor module.

Semiconductor modules have one or a plurality of semiconductor substrates or semiconductor chips which have to be connected up to terminals of the semiconductor module and/or to one another. Advancing miniaturization of the semiconductor chips means that the current density in the semiconductor chips rises with the chip area remaining the same, whereby the dissipation of heat from the semiconductor chips is made more difficult. This problem occurs in the case of power semiconductor modules, for example, such as bridge circuits for rectifier, inverter or converter circuits, for example, which have power transistors such as IGB (Insulated Gate Bipolar) transistors, for example.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 7 illustrates an exemplary embodiment of a flow chart of a method for producing a semiconductor module.

FIG. 8 illustrates a further exemplary embodiment of a semiconductor module in a cross section.

DETAILED DESCRIPTION

Figure 1:
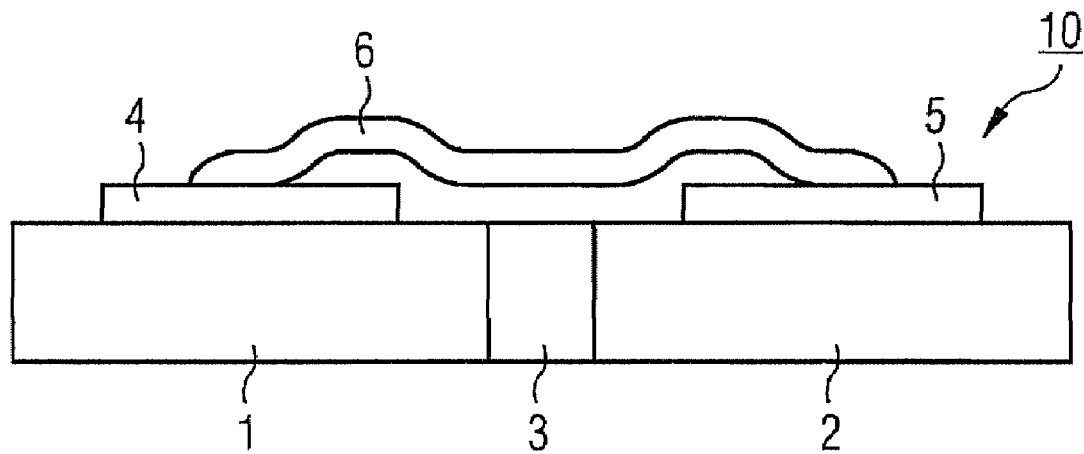
FIG. 1 illustrates an exemplary embodiment of a semiconductor module in a cross section.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various embodiments described herein may be combined with each other, unless specifically noted otherwise.

Semiconductor modules including semiconductor substrates, and methods for producing the semiconductor modules are described below. Semiconductor substrates are generally also referred to as semiconductor chips. The specific construction and the specific embodiment of the semiconductor chips or semiconductor substrates are not of importance in this case. The semiconductor substrates can be for example integrated circuits of any desired form, power transistors, power diodes, microprocessors or microelectromechanical components. By way of example, semiconductor chips having a vertical structure can be involved, that is to say that the semiconductor chips can be fabricated in such a way that electric currents can flow in a direction perpendicular to the main surfaces of the semiconductor chip. A semiconductor chip having a vertical structure can have contact elements in particular on its two main surfaces, that is to say on its top side and underside. In particular power transistors and power diodes can have a vertical structure. By way of example, the source and gate terminals of a power transistor or the anode terminal of a power diode can be situated on one main surface, while the drain terminal of the power transistor or the cathode terminal of the power diode is arranged on the other main surface. A power diode can be embodied in particular as a Schottky diode. The semiconductor chips need not be fabricated from a specific semiconductor material; they can moreover also contain nonconductive inorganic and/or organic materials. The semiconductor chips can be packaged or unpackaged.

The semiconductor substrates can also contain in each case one or a plurality of electronic components. The components can be active or passive components. The components can be diodes or transistors, for example. The components can also be in the form of power components such as power transistors, e.g., IGBT (Insulated Gate Bipolar) transistors. The semiconductor substrates can also have in each case an integrated circuit containing a plurality of components.

The semiconductor chips can have contact elements enabling electrical contact to be made with the semiconductor chips. The contact elements can include any desired conductive material, for example a metal, such as e.g., aluminium, gold or copper, a metal alloy or a conductive organic material.

The semiconductor chips are arranged on carriers. The carriers can serve, inter alia, as a heat sink for dissipating the heat generated by the semiconductor chips. The carriers include electrically conductive materials. These can be electrically conductive materials such as e.g., copper or iron-nickel alloys. However, electrically conductive materials such as a carbon fiber-copper composite material can also be used. The carriers can in each case be electrically connected to a contact element of the semiconductor chip by which the semiconductor chip is seated on the carrier. The electrical connections can be produced e.g., by using reflow soldering, vacuum soldering, diffusion soldering or adhesive bonding by using a conductive adhesive.

If diffusion soldering is used as connecting technique between carrier and semiconductor chip, solder materials can be used which lead to intermetalic phases after the end of the soldering process at the interface between carrier and semiconductor chip on account of interface diffusion processes. In this case, for example the use of AuSn, AgSn, CuSn, AgIn, AuIn or CuIn solders is conceivable for copper or iron-nickel carriers.

If the carriers are adhesively bonded to the semiconductor chips, conductive adhesives can be used. The adhesives can be based e.g., on epoxy resins and be enriched with gold, silver, nickel or copper in order to produce the electrical conductivity.

The contact elements of the semiconductor chips can have a diffusion barrier. During diffusion soldering, the diffusion barrier prevents solder material from diffusing from the carrier into the semiconductor chip. A thin titanium layer on a contact element effects such a diffusion barrier, by way of example.

The semiconductor module includes, inter alia, an electrically insulating element having an electrically insulating material. The electrically insulating material can contain or include an oxide such as a semiconductor oxide, for example silicon oxide, or a nitride such as a semiconductor nitride, such as silicon nitride for example. However, the electrically insulating material can also contain or include for example a ceramic material.

The semiconductor module also contains an electrically conductive layer. The latter can be applied by using an electrodeposition method, for example. However, it can also be applied for example, by some other deposition method such as a vapor deposition method, a liquid-phase deposition method or a sputtering method.

In one embodiment, a semiconductor module includes a first electrically conductive carrier composed of a first material, a second electrically conductive carrier composed of the first material, an electrically insulating element composed of a second material, which connects the first carrier and the second carrier to one another, a first semiconductor substrate applied to the first electrically conductive carrier, a second semiconductor substrate applied to the second electrically conductive carrier, and an electrically conductive layer applied above the first carrier, the second carrier and the insulating element, which electrically conductive layer electrically conductively connects the first semiconductor substrate to the second semiconductor substrate.

In another embodiment, a semiconductor module includes an electrically conductive substrate, a trench, which is formed in the electrically conductive substrate and is filled with an electrically insulating material, a first semiconductor, which is applied on the electrically conductive substrate on a first side of the trench, and a second semiconductor substrate, which is applied on the electrically conductive substrate on a second side of the trench.

In one embodiment, in a method for producing a semiconductor module, a first and second semiconductor substrate are applied to an electrically conductive substrate, an electrically conductive layer is applied to the first semiconductor substrate and the second semiconductor substrate, and the first semiconductor substrate is separated from the second semiconductor substrate by severing the electrically conductive substrate.

FIG. 1 illustrates an embodiment of a semiconductor module in a cross section. The semiconductor module 10 includes a first electrically conductive carrier 1 composed of a first material, a second electrically conductive carrier 2 composed of the first material, and an electrically insulating element 3 composed of a second material, which connects the first carrier 1 and the second carrier 2 to one another. A first semiconductor substrate 4 is applied to the first electrically conductive carrier 1 and a second semiconductor substrate 5 is applied to the second electrically conductive carrier 2. An electrically conductive layer 6 is applied above the first carrier 1, the second carrier 2 and the insulating element 3, which electrically conductive layer electrically conductively connects the first semiconductor substrate 4 to the second semiconductor substrate.

In the embodiment of a semiconductor module 10 as illustrated in FIG. 1, the first semiconductor substrate 4 and the second semiconductor substrate 5 can in each case have, at their upper surfaces, electrical contacts which are in each case electrically conductively connected to the electrically conductive layer 6. The first semiconductor substrate 4 can furthermore have, on its lower surface, an electrical contact connected to the electrically conductive first carrier 1. The second semiconductor substrate 5 can likewise have, at its lower surface, an electrical contact connected to the second electrically conductive carrier 2.

Figure 2:
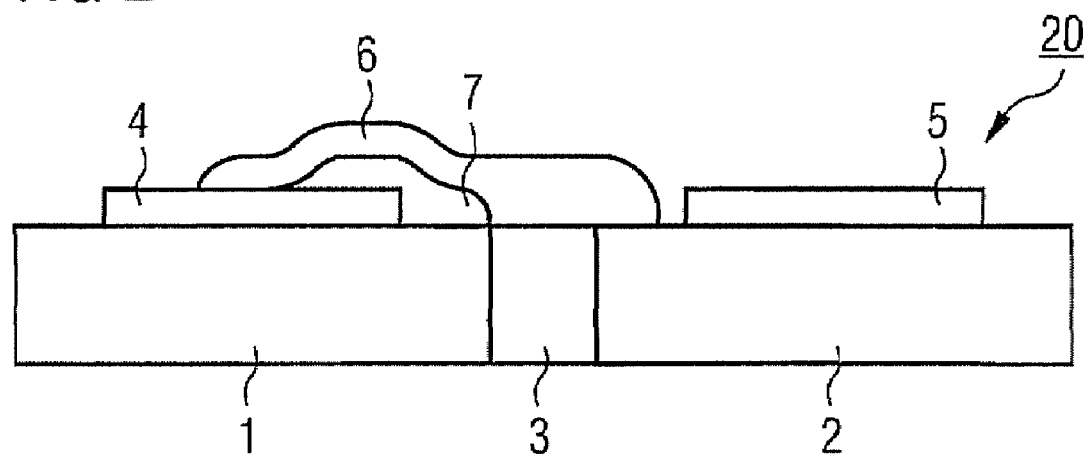
FIG. 2 illustrates a further exemplary embodiment of a semiconductor module in a cross section.

FIG. 2 illustrates a further exemplary embodiment of a semiconductor module in a cross section. With regard to the first electrically conductive carrier 1, the second electrically conductive carrier 2, the electrically insulating element 3, the first semiconductor substrate 4 and the second semiconductor substrate 5 and the relative arrangement of these elements with regard to one another, the semiconductor module 20 can be constructed in precisely the same way as the semiconductor module 10 illustrated in FIG. 1. Likewise, in the semiconductor module 20, too, an electrically conductive layer 6 is applied above the first electrically conductive carrier 1, the second electrically conductive carrier 2 and the insulating element 3, which electrically conductive layer electrically conductively connects the first semiconductor substrate 4 to the second semiconductor substrate 5. In contrast to the semiconductor module 10 illustrated in FIG. 1, however, in the semiconductor module 20 in FIG. 2, the electrically conductive layer 6 is applied in such a way that it makes contact with the first semiconductor substrate 4 at an upper surface, while the electrically conductive layer 6 is connected to the second electrically conductive carrier 2. The first semiconductor substrate 4 can have, at its upper surface, an electrical contact connected to the electrically conductive layer 6. The second semiconductor substrate 5 can have, at its lower surface, an electrical contact which is connected to the second electrically conductive carrier 2 and is therefore connected to the electrically conductive layer 6. Consequently, the electrically conductive layer 6 connects an upper electrical contact of the first semiconductor substrate 4 to a lower electrical contact of the second semiconductor substrate 5.

Further embodiments of the semiconductor modules illustrated in FIGS. 1 and 2 are explained below.

In a further embodiment, in a semiconductor module, the first material from which the first electrically conductive carrier 1 and the second electrically conductive carrier 2 are formed can have a sintered material or include a sintered material. This opens up the possibility, for example, of imparting a specific shaping to the first and/or second carrier at the surfaces thereof in a highly practicable manner, such as, for example, cutouts such as trenches or beads or other regular structures which can assume the function of cooling fins, as will also be illustrated on the basis of further embodiments.

In a further embodiment of a semiconductor module, the first material can have a carbon fiber-copper composite material or include a material of this type. A material of this type is advantageous with regard to its electrical conduction properties and also with regard to its thermal conduction properties. What is more, a carbon fiber-copper composite material can have a coefficient of thermal expansion which is close to the coefficient of thermal expansion of silicon, such that only small mechanical stresses of the arrangement result in the event of thermal loadings on account of high currents of the electronic components.

In a further embodiment of a semiconductor module, the first material can also have a different material from a carbon fiber-copper composite material. The material is chosen, however, in such a way that it has a coefficient of thermal expansion of less than $6 \times 10^{-6}$ 1/K, in order to limit the mechanical stress of the overall arrangement in the event of thermal loadings on account of high currents.

In a further embodiment of a semiconductor module, the insulating material of the electrically insulating element 3 has a ceramic material.

In a further embodiment of a semiconductor module which is realized in the embodiments of FIGS. 1 and 2, the first carrier 1, the second carrier 2 and the insulating element 3 have in each case first surfaces lying within a first common plane and in each case second surfaces lying within a second common plane. The semiconductor substrates 4 and 5 are respectively applied on the first surfaces of the first carrier 1 and of the second carrier 2 which are illustrated in FIGS. 1 and 2.

In a further embodiment of a semiconductor module, at least one cutout is formed in the first carrier 1 and/or the second carrier 2, the first semiconductor substrate 4 and/or the second semiconductor substrate being arranged in the at least one cutout. Consequently, in a modification of the embodiments of a semiconductor module which are illustrated in FIGS. 1 and 2, at least one or both of the semiconductor substrates 4 or 5 are not applied on a planar surface of the respective carrier 1 or 2, but rather are arranged in the corresponding cutouts. The at least one cutout can have for example the form of a trench or a bead.

In a further embodiment, at least one of the semiconductor substrates 4 or 5 is applied to the first carrier 1 or the second carrier 2 by using a soldering connection. The soldering connection can be produced by using diffusion soldering using gold and/or tin.

In a further embodiment of a semiconductor module, the first carrier 1 and/or the second carrier 2 can have cooling fins which can be formed into a surface of the carrier which is remote from the respective semiconductor substrate 4 or 5. The cooling fins enlarge the surface area, whereby the heat can be dissipated more rapidly during operation of the semiconductor module.

In a further embodiment of a semiconductor module, the insulating element 3 is formed in such a way that it encloses the first carrier 1 and/or the second carrier 2.

In a further embodiment of a semiconductor module, the latter has at least one connection contact which is formed from the first material and which is isolated from the first carrier 1 and/or the second carrier 2 by using a further insulating element. In this case, the further insulating element can have a ceramic material. In this case, the connection contact can have a hole for screwing on a current connection. An electrically conductive elevation can be applied on the connection contact, such that the semiconductor module can be mounted on a circuit board, for example, by using the elevation and, if appropriate, further electrically conductive elevations applied on further connection contacts, by using flip-chip mounting. Furthermore, the connection contact can be connected to a semiconductor substrate applied on the first carrier 1 and/or the second carrier 2 by using an electrically conductive layer applied on the further insulating element.

In a further embodiment of a semiconductor module, the first semiconductor substrate 4 and the second semiconductor substrate and, if appropriate, further semiconductor substrates can be connected to one another for the purpose of forming a bridge circuit. In this case, the bridge circuit can have the function of a rectifier, converter or inverter circuit.

In a further embodiment of a semiconductor module, the first carrier 1 and/or the second carrier 2 can be connected to a heat sink. In this case, the respective carrier can be applied to an insulating plate, which is then applied to a heat sink, or the respective carrier can be applied to an electrically insulating heat sink.

In a further embodiment of a semiconductor module, at least one semiconductor substrate can include a power semiconductor chip. In this case, the power semiconductor chip can have a power transistor such as an IGB (Insulated Gate Bipolar) transistor, for example.

Figure 3:
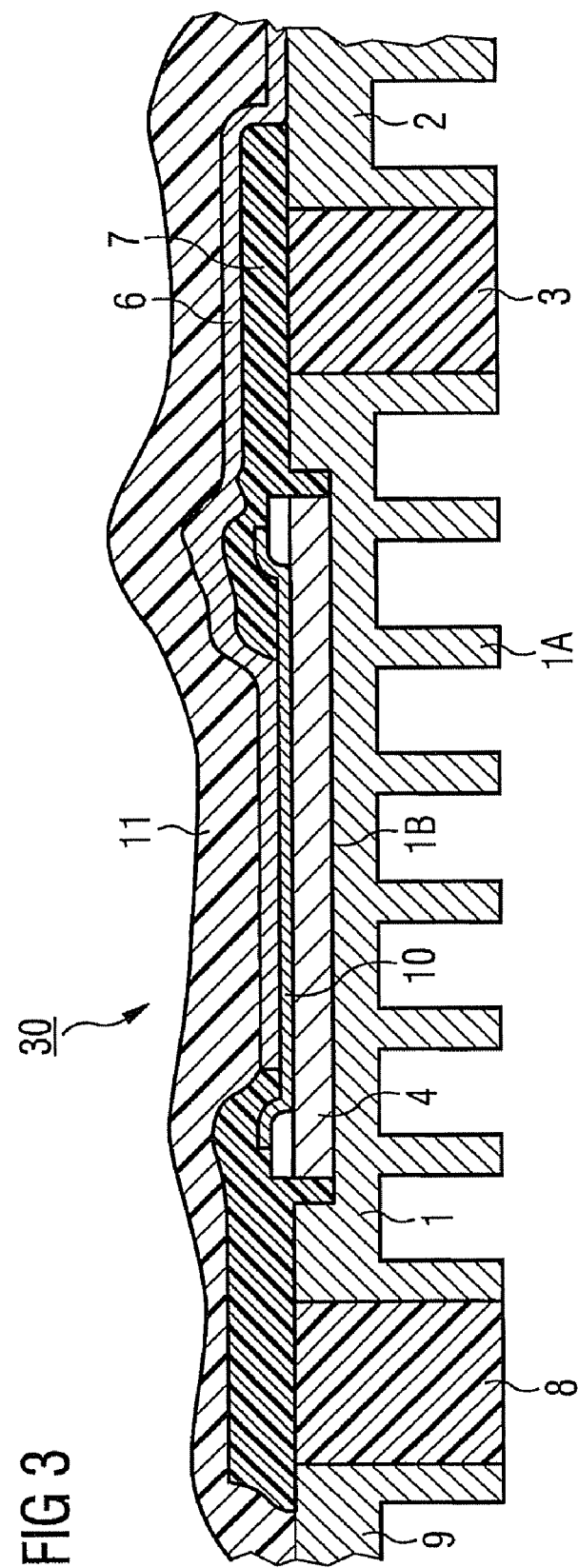
FIG. 3 illustrates a further exemplary embodiment of a semiconductor module in a cross section.

FIG. 3 illustrates a further embodiment of a semiconductor module in a cross section. This embodiment of a semiconductor module corresponds, in principle, to the embodiment illustrated in FIG. 2, as will also be explained below. A first electrically conductive carrier 1 is produced from a carbon fiber-copper composite material by using a sintering method. The sintering method makes it possible to provide the electrically conductive carrier 1 with a specific shaping at its main surfaces. A cutout 1B is formed at a first upper surface of the electrically conductive carrier 1, which cutout can assume for example the form of a bead or a trench. The cutout 1B serves for receiving a first semiconductor substrate 4. The depth of the cutout 1B can be chosen in a manner corresponding to the thickness of the first semiconductor substrate, such that the upper surface of the first semiconductor substrate 4 is flush with the first upper surface of the first carrier 1. This facilitates further process-technological processing, in particular the application of the further layers, as will be explained below. Furthermore, cooling fins 1A are formed in a second lower surface of the first carrier 1 by using the sintering method, by using which cooling fins and accelerated heat dissipation is intended to be brought about during operation of the completed semiconductor module.

The first carrier 1 is mechanically connected to an adjacent electrically conductive carrier 2, which is only partly illustrated, by using an electrically insulating element 3. The first upper surface of the first carrier 1, a first upper surface of the insulating element 3 and first upper surface of the second carrier 2 lie in a common first plane and a second lower surface of the first carrier 1, a second lower surface of the insulating element 3 and a second lower surface of the second carrier 2 lie in a common second plane. The second carrier 2 can be provided with cooling fins at its second lower surface in the same way as the first carrier 1.

The first carrier 1 is furthermore connected to a further electrically conductive carrier 9 by using a further electrically insulating element 8. In this case, too, it can be provided that a first upper surface of the further insulating element 8 and a first upper surface of the further carrier 9 lie in the first common plane and a second lower surface of the further insulating element 8 and a second lower surface of the further carrier 9 lie in the second common plane.

The electrically conductive carriers 2 and 9 are likewise produced from a sintered carbon fiber-copper composite material.

The semiconductor module 30 can furthermore have electrical connection contacts which lie further outside and are not illustrated and which are likewise fabricated from the first material of the electrically conductive carriers 1, 2 and 9 and are likewise aligned with regard to their upper and lower surfaces with the first upper surfaces and the second lower surfaces of the electrically conductive carriers 1, 2 and 9.

It should already be pointed out at this juncture that the semiconductor module 30 in FIG. 3 can be produced in accordance with an embodiment of a method which is yet to be explained and in which a plurality of initially contiguous semiconductor modules are processed jointly in a wafer assemblage and are mechanically separated from one another after completion of the processing.

The first semiconductor substrate 4 is applied on a bottom area of the cutout 1B. The semiconductor substrate 4 can be applied by diffusion soldering using a gold/tin alloy. An electrical contact can be applied on the lower surface of the first semiconductor substrate 4, which electrical contact is therefore electrically conductively connected to the first carrier 1. The first carrier 1 can be connected to an outer connection contact or a further electrically conductive carrier by using an electrically conductive layer in a different plane from the cross-sectional plane illustrated.

A thin electrically conductive layer 10 is applied on the upper surface of the first semiconductor substrate 4, and is in contact with an electrical connection on the upper surface. The electrically insulating layer 7 is then deposited onto the first carrier 1, the insulating elements 3 and 8 and also edge regions of the carriers 2 and 9 in such a way that only edge regions of the electrically conductive layer 10 are covered by the electrically insulating layer. The electrically insulating layer 7 can contain or include a photosensitive resist, such as a photoimide, for example. The electrically conductive layer 6 is then deposited onto that part of the electrically conductive layer 10 which is not covered by the electrically insulating layer 7, which electrically conductive layer 6 is in electrically conductive contact with the second carrier 2. Consequently, as in the embodiment illustrated in FIG. 2, an electrical contact applied on the upper surface of the first semiconductor substrate 4 can be electrically conductively connected by using the electrically conductive layer 6 to one on a lower surface of the second semiconductor substrate 5 (not illustrated in FIG. 3) applied on the second carrier 2.

An electrically insulating cover layer 11 is then also deposited above the carriers 1, 2 and 9, the insulating layer 7 and the electrically conductive layer 6.

Figure 4:
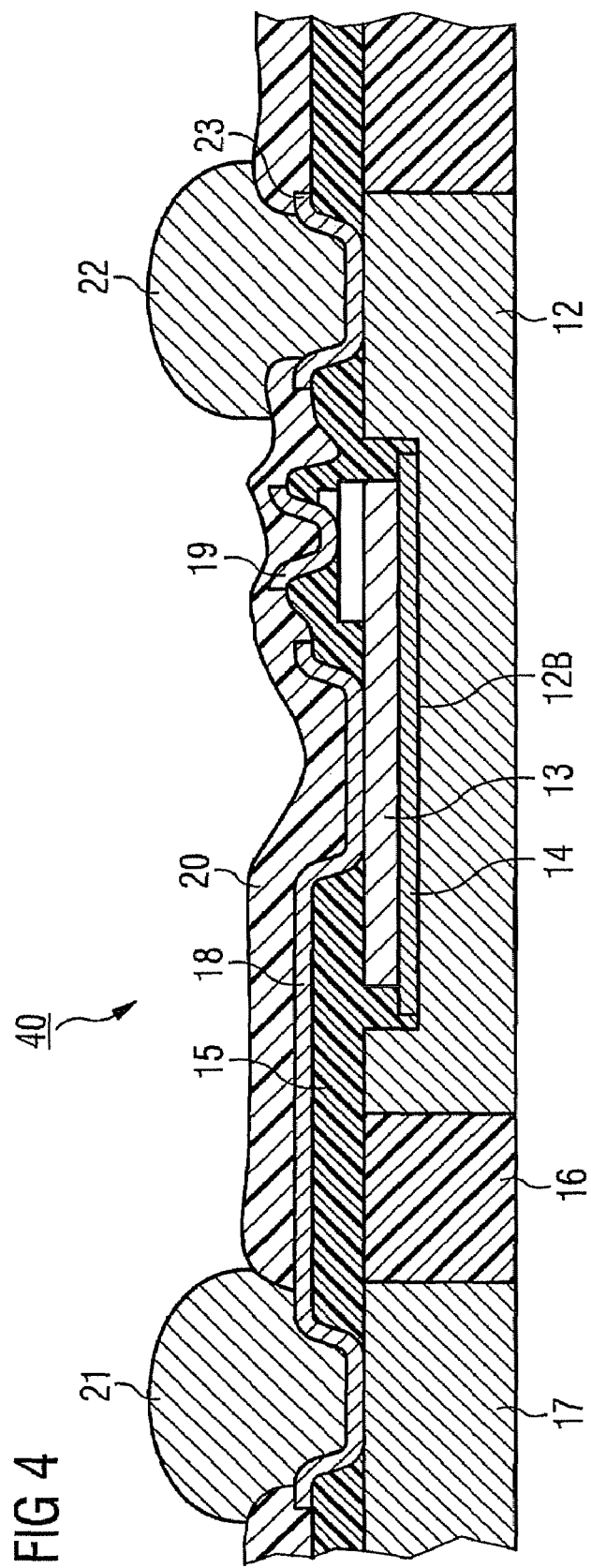
FIG. 4 illustrates a further exemplary embodiment of a semiconductor module in a cross section.

FIG. 4 illustrates a further exemplary embodiment of a semiconductor module in a cross section, the semiconductor substrates, which correspond to the semiconductor substrates 4 and 5 in the exemplary embodiments of FIGS. 1 and 2, not being illustrated for reasons of clarity. This exemplary embodiment illustrates a section of a semiconductor module 40 in which a semiconductor substrate 13 applied on a carrier 12 is connected to outer connection contacts. The electrically conductive carrier 12 has a cutout 12B, in which the semiconductor substrate 13 is applied on the bottom of the cutout 12B by using a soldering layer 14. The semiconductor substrate 13 can be identical to one of the semiconductor substrates 4 or 5 illustrated in the embodiments of FIGS. 1 to 3 and be illustrated in a different cross-sectional plane. However, it can also be another semiconductor substrate which is different from the semiconductor substrates 4 or 5 and which is contained in the semiconductor module.

A first insulating layer 15 is applied on the semiconductor substrate 13 and the carrier 12. The carrier 12 is mechanically connected by a first insulating element 16 to a connection 17 produced from the same material as the carrier 12. A first electrically conductive layer 18 is applied on the first insulating layer 15, and connects a first connection contact on the upper surface of the semiconductor substrate 13 to the outer connection 17. A second electrically conductive layer 19 is connected to a further connection contact on the upper surface of the semiconductor substrate 13. A second insulating layer 20 is applied on the electrically conductive layers 18 and 19. The first insulating layer 15 and the second insulating layer 20 can both contain or include a photosensitive resist such as a photoimide.

In the region of the outer connection 17, a first electrically conductive elevation is applied on the first electrically conductive layer 18, which elevation can be for example a solder ball composed of tin or tin-containing alloy. A second electrically conductive elevation 22 is connected to the carrier 12 by using an electrically conductive layer 23. The electrically conductive elevations 21 and 22 enable flip-chip mounting of the semiconductor module 40.

Figure 5:
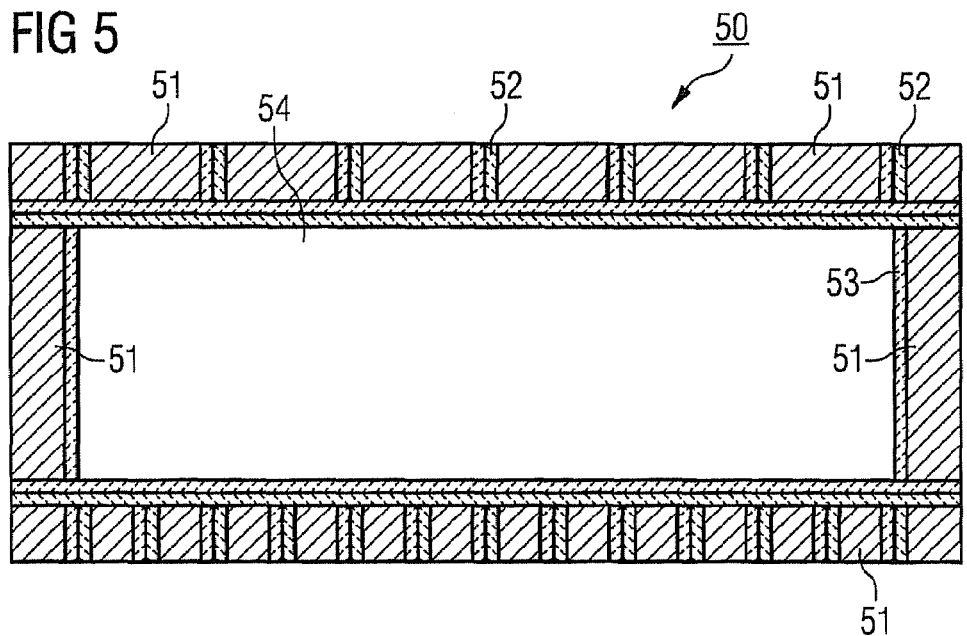
FIG. 5 illustrates a further exemplary embodiment of a semiconductor module in a plan view.

FIG. 5 illustrates a further exemplary embodiment of a semiconductor module in a plan view, the semiconductor substrates, which correspond to the semiconductor substrates 4 and 5 in the exemplary embodiments of FIGS. 1 and 2, not being illustrated for reasons of clarity. This exemplary embodiment illustrates a complete, finished semiconductor module such as can be obtained for example by using a wafer level method yet to be described after the wafer has been separated into individual semiconductor modules. The semiconductor module 50 has a plurality of outer connection contacts 51. The latter can correspond for example, to the outer connection 17 illustrated in the exemplary embodiment of FIG. 4, optionally either a solder ball 21 being applied for flip-chip mounting or the outer connection 17 itself being used as connection contact. Insulating elements 52 are in each case situated between the connection contacts 51, such that the connection contacts 51 are electrically insulated from one another. The connection contacts 51 are electrically insulated from an inner region 54, in which the semiconductor substrates are arranged, by using a peripheral electrically insulating region 53. The insulating elements 52 and the insulating region 53 can be formed by a ceramic material in the manner already described above.

Figure 6:
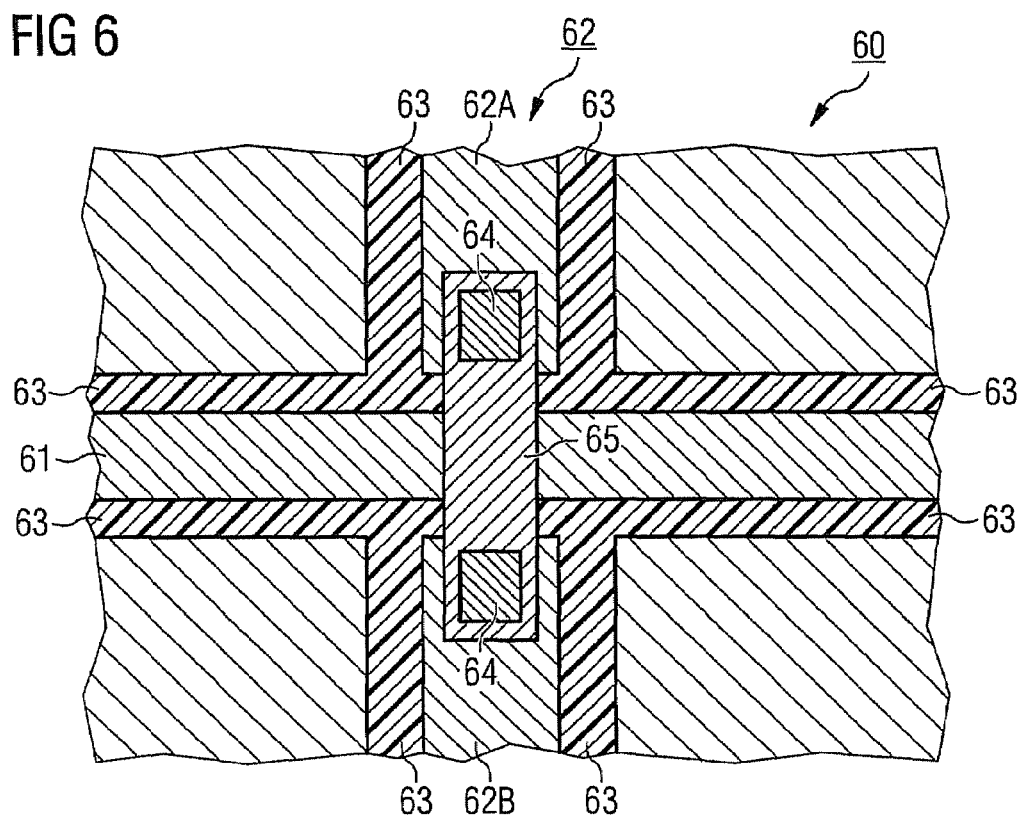
FIG. 6 illustrates a further exemplary embodiment of a semiconductor module in a plan view.

FIG. 6 illustrates a further exemplary embodiment of a semiconductor module in a plan view, the semiconductor substrates, which correspond to the semiconductor substrates 4 and 5 in the exemplary embodiments of FIGS. 1 and 2, not being illustrated for reasons of clarity. This exemplary embodiment of a semiconductor module 60 illustrates a section of the semiconductor module in which two electrical interconnects cross without being in contact with one another. The interconnects include a first interconnect 61 and a second interconnect 62, which has two interconnect sections 62A and 62B. The first interconnect 61 and the interconnect sections 62A and 62B can be regions of an electrically conductive substrate. Electrically insulating material 63 is situated between the electrically conductive regions. The first interconnect 61 is led through the region between the interconnect sections 62A and 62B. The interconnect sections 62A and 62B are connected to one another by an electrically conductive bridge which bridges the first interconnect 61. The electrically conductive bridge is formed by electrically conductive vias 64 being formed into an electrically insulating layer (not discernible in the drawing) applied above the interconnects 61 and 62, which vias are then connected to one another by an electrically conductive layer 65 deposited on the electrically insulating layer.

FIG. 7 illustrates an exemplary embodiment of a flow chart of a method for producing a semiconductor module. In the method for producing a semiconductor module, a first and a second semiconductor substrate are applied to an electrically conductive substrate (s1), an electrically conductive layer is applied above the electrically conductive substrate (s2), and the first semiconductor substrate is separated from the second semiconductor substrate by severing the electrically conductive substrate (s3).

In one embodiment, the electrically conductive substrate is present in the form of a wafer. This means that the semiconductor substrates and the electrically conductive layer are applied to the wafer, such that a plurality of semiconductor chips can be produced and wired simultaneously. After this processing, the wafer is then mechanically separated into the individual semiconductor modules containing the wired semiconductor substrates.

In a further embodiment, the electrically conductive substrate can be produced by using a sintering process. This enables, in particular, a specific shaping of the substrate such as, for example, cutouts for receiving the semiconductor substrates or cooling fins.

In a further embodiment, electrically insulating regions can be formed into the electrically conductive substrate. The insulating regions are required in order to produce electrical circuits in the semiconductor module or the semiconductor modules. The electrically insulating regions can be formed by a procedure in which trenches are formed into a first surface of the electrically conductive substrate, the trenches are filled with an electrically insulating material, and the electrically conductive substrate is removed at a second surface opposite the first surface until the electrically insulating material is uncovered at the sections of the trenches. The removal can be carried out by grinding away, in which case purely mechanical grinding away or else grinding away by using an assisting chemical component, such as chemical mechanical polishing, for instance, can be employed.

In a further embodiment, one or a plurality of cutouts can be formed into the electrically conductive substrate, the first semiconductor substrate and/or the second semiconductor substrate being arranged in the cutouts. The cutouts can have the form of trenches or beads and they can have a depth corresponding to the height of the semiconductor substrates.

In a further embodiment, the first and/or the second semiconductor substrate can be applied to the electrically conductive substrate by using soldering, in particular by using diffusion soldering.

In a further embodiment, the first and/or the second semiconductor substrate can be fixed on the electrically conductive substrate with gold and/or tin, in particular with a gold-tin alloy.

In a further embodiment, cooling fins can be formed into the electrically conductive substrate, in which case the cooling fins can be formed into a surface of the electrically conductive substrate opposite to the semiconductor substrates.

In a further embodiment, at least one connection contact can be formed by forming a further electrically insulating region in the electrically conductive substrate in a region between a semiconductor substrate and an edge region of the semiconductor module. In this case, a trench can be formed into a first surface of the electrically conductive substrate and be filled with an electrically insulating material, and the electrically conductive substrate can subsequently be removed at a second surface opposite the first surface until the electrically insulating material is uncovered at the section of the trench.

In a further embodiment, the electrically conductive substrate can be connected to a heat sink. In this case, the electrically conductive substrate can be connected to the heat sink by using a melting method, in particular a DCB (Direct Copper Bonding) method.

FIG. 8 illustrates a further exemplary embodiment of a semiconductor module in a cross section. The semiconductor module 70 includes an electrically conductive substrate 71, a trench 72, which is formed in the electrically conductive substrate 71 and is filled with an electrically insulating material 72A, and a first semiconductor substrate 73, which is applied on the electrically conductive substrate 71 on a first side of the trench 72, and a second semiconductor substrate 74, which is applied on the electrically conductive substrate on a second side of the trench 72.

The semiconductor module 70 can be an intermediate product of the method described further above, in which the application of semiconductor substrates which are intended to be separated from one another has already been effected but the severing has not yet been effected. A trench 72 filled with insulating material 72A between the semiconductor substrates 73 and 74 has been formed. In a next process, the electrically conductive substrate 71 is then intended to be removed as far as the line 75 until the insulating material 72A is uncovered at the lower surface.

In one embodiment of the semiconductor module, the electrically conductive substrate 71 has the form of a wafer. The semiconductor module 70 can therefore form an intermediate product of the method for producing a semiconductor module as described further above.

In a further exemplary embodiment of a semiconductor module, the electrically conductive substrate 71 has a sintered material.

In a further exemplary embodiment of a semiconductor module, the electrically conductive substrate 71 has a carbon fiber-copper composite material.

In a further exemplary embodiment of a semiconductor module, the electrically conductive substrate 71 has a coefficient of thermal expansion which is less than $6\times10^{-6}$ 1/K.

In a further exemplary embodiment of a semiconductor module, the insulating material has a ceramic material.

In a further exemplary embodiment of a semiconductor module, at least one cutout is formed in the electrically conductive substrate 71, the first semiconductor substrate 73 or the second semiconductor substrate being arranged in the at least one cutout.

In a further exemplary embodiment of a semiconductor module, an electrically conductive layer is provided, which connects the first semiconductor substrate 73 to the second semiconductor substrate 74 and is applied on the electrically conductive substrate 71 and the trench 72.

In a further exemplary embodiment of a semiconductor module, the first semiconductor substrate 73 and/or the second semiconductor substrate 74 are/is applied to the electrically conductive substrate 71 by using a soldering connection.

In a further exemplary embodiment of a semiconductor module, the electrically conductive substrate 71 has cooling fins.

In a further exemplary embodiment of a semiconductor module, the cooling fins are formed into a surface of the electrically conductive substrate 71 which is remote from the semiconductor substrates 73 and 74.

In a further exemplary embodiment of a semiconductor module, a connection contact formed from the material of the electrically conductive substrate 71 is provided, which is isolated from the electrically conductive substrate 71 by a further trench filled with an electrically insulating material. The connection contact can be connected to the first semiconductor substrate 73 or the second semiconductor substrate 74 by an electrically conductive layer applied on the further trench. An electrically conductive elevation, in particular a solder ball, can be applied on the connection contact.

In a further exemplary embodiment of a semiconductor module, the first semiconductor substrate 73 and the second semiconductor substrate 74 and, if appropriate, further semiconductor substrates can be connected to one another for the purpose of forming a bridge circuit, in particular an inverter, rectifier or converter circuit.

In a further exemplary embodiment of a semiconductor module, at least one semiconductor substrate can include a power semiconductor chip.

In a further exemplary embodiment of a semiconductor module, the electrically conductive substrate 71 can be connected to a heat sink.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor module comprising;
   applying a first and second semiconductor substrate to an electrically conductive substrate;
   applying an electrically conductive layer to above the electrically conductive substrate;
   separating the first semiconductor substrate from the second semiconductor substrate by severing the electrically conductive substrate;
   forming electrically insulating regions into the electrically conductive substrate;
   forming trenches into a first surface of the electrically conductive substrate;
   filling the trenches with an electrically insulating material; and
   removing the electrically conductive substrate at a second surface opposite the first surface until the electrically insulating material is uncovered at the sections of the trenches.

2. The method of claim 1, comprising producing the electrically conductive substrate by using a sintering process.

3. The method of claim 1, comprising wherein the electrically conductive substrate is present in the form of a wafer.

4. The method of claim 1, comprising wherein the electrically insulating material is a ceramic material.

5. The method of claim 1, applying the first and/or the second semiconductor substrate to the electrically conductive substrate by soldering.

6. The method of claim 1, fixing the first and/or the second semiconductor substrate on the electrically conductive substrate with gold and/or tin.

7. The method of claim 1, forming cooling fins into the electrically conductive substrate.

8. The method of claim 1, comprising connecting the electrically conductive substrate to a heat sink.

9. The method of claim 8, comprising connecting the electrically conductive substrate to the heat sink by using a melting method.

10. A method for producing a semiconductor module comprising;
    applying a first and a second semiconductor substrate to an electrically conductive substrate;
    applying an electrically conductive layer to above the electrically conductive substrate;
    separating the first semiconductor substrate from the second semiconductor substrate by severing the electrically conductive substrate; and
    forming one or a plurality of cutouts into the electrically conductive substrate, the first semiconductor substrate and/or the second semiconductor substrate being arranged in the cutouts.

11. A method for producing a semiconductor module comprising;
    applying a first and second semiconductor substrate to an electrically conductive substrate;
    applying an electrically conductive layer to above the electrically conductive substrate;
    separating the first semiconductor substrate from the second semiconductor substrate by severing the electrically conductive substrate; and
    forming at least one connection contact by forming a further electrically insulating element in the electrically conductive substrate in a region between a semiconductor substrate and an edge region of the semiconductor module.

12. The method of claim 11, comprising:
    forming a trench into a first surface of the electrically conductive substrate and filled with an electrically insulating material; and
    removing the electrically conductive substrate at a second surface opposite the first surface until the electrically insulating material is uncovered at a section of the trench.

13. A method for producing a semiconductor module comprising:
    applying a first and a second semiconductor substrate to an electrically conductive substrate;
    applying an electrically conductive layer to above the electrically conductive substrate;
    separating the first semiconductor substrate from the second semiconductor substrate by severing the electrically conductive substrate; and
    connecting the first semiconductor substrate to the second semiconductor substrate to form a bridge circuit.

* * * * *

UNITED STATES PATENT AND TRADEMARK OFFICE
CERTIFICATE OF CORRECTION

| | | |
|---|---|---|
| PATENT NO. | : 7,632,712 B2 | Page 1 of 1 |
| APPLICATION NO. | : 11/828843 | |
| DATED | : December 15, 2009 | |
| INVENTOR(S) | : Kroener | |

It is certified that error appears in the above-identified patent and that said Letters Patent is hereby corrected as shown below:

Column 12, line 23, claim 11, delete "and second" and insert in place thereof --and a second--.

Signed and Sealed this

Sixth Day of April, 2010

David J. Kappos
*Director of the United States Patent and Trademark Office*